United States Patent
Kim et al.

(10) Patent No.: US 12,027,439 B2
(45) Date of Patent: Jul. 2, 2024

(54) VEHICLE POWER MODULE

(71) Applicants: Hyundai Motor Company, Seoul (KR); Kia Corporation, Seoul (KR)

(72) Inventors: Tae Hwa Kim, Whasung-Si (KR); Suk Hyun Lim, Whasung-Si (KR); Nam Sik Kong, Whasung-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 104 days.

(21) Appl. No.: 17/985,693

(22) Filed: Nov. 11, 2022

(65) Prior Publication Data

US 2024/0071858 A1 Feb. 29, 2024

(30) Foreign Application Priority Data

Aug. 24, 2022 (KR) ........................ 10-2022-0106440

(51) Int. Cl.
*H01L 23/367* (2006.01)
*H01L 23/373* (2006.01)
(Continued)

(52) U.S. Cl.
CPC ...... *H01L 23/3675* (2013.01); *H01L 23/3735* (2013.01); *H01L 23/40* (2013.01); *H01L 23/495* (2013.01)

(58) Field of Classification Search
CPC ..... H01L 23/28; H01L 23/31; H01L 23/3107; H01L 23/3135; H01L 23/367; H01L 23/3675; H01L 23/373; H01L 23/3735; H01L 23/3736; H01L 23/4334; H01L 23/4924; H01L 23/495; H01L 23/49568; H01L 23/49844; H01L 23/49894; H01L 21/48; H01L 21/4871; H01L 21/4882; H01L 21/52; H01L 21/56; H01L 21/565; H01L 24/27; H01L 24/29; H01L 24/32; H01L 24/33; H01L 24/73; H01L 24/83;
(Continued)

(56) References Cited

U.S. PATENT DOCUMENTS

2009/0116197 A1* 5/2009 Funakoshi .......... H01L 21/4882
438/122
2016/0005676 A1* 1/2016 Orimoto ............. H01L 23/3736
257/714
(Continued)

FOREIGN PATENT DOCUMENTS

KR 10-2017-0071142 6/2017
KR 20210073328 A * 6/2021 ............. H01L 23/31

OTHER PUBLICATIONS

KR-20210073328-A English Translation (Year: 2021).*

*Primary Examiner* — Amir A Jalali
(74) *Attorney, Agent, or Firm* — MORGAN, LEWIS & BOCKIUS LLP

(57) ABSTRACT

A vehicle power module includes an upper substrate and a lower substrate spaced from each other in a vertical direction, a semiconductor chip connected to one of the upper substrate and the lower substrate, and a spacer formed of a metal material containing copper and connecting the semiconductor chip to the other of the upper substrate and the lower substrate or to connect the upper substrate to the lower substrate, the spacer including a plurality of penetration portions formed to penetrate an inside thereof.

9 Claims, 2 Drawing Sheets

(51) Int. Cl.
*H01L 23/40* (2006.01)
*H01L 23/495* (2006.01)

(58) Field of Classification Search
CPC ....... H01L 25/07; H01L 25/072; H01L 25/18; H01L 25/50; H01L 29/7393; H01L 2224/2612; H01L 2224/29147; H01L 2224/32245; H01L 2224/73251; H01L 2224/83801; H01L 2924/01029; H01L 2924/1203; H05K 7/209; H05K 7/20409; H05K 3/107; H05K 3/3468; H05K 1/0204; H05K 1/14
See application file for complete search history.

(56) References Cited

U.S. PATENT DOCUMENTS

| | | | |
|---|---|---|---|
| 2016/0126157 A1* | 5/2016 | Jeon | H01L 25/18 257/693 |
| 2020/0111721 A1* | 4/2020 | Park | H01L 24/33 |
| 2020/0357720 A1* | 11/2020 | Park | H01L 23/3672 |
| 2021/0035892 A1* | 2/2021 | Chew | H01L 23/367 |
| 2021/0265235 A1* | 8/2021 | Park | H01L 23/473 |
| 2021/0305193 A1* | 9/2021 | Choi | H01L 25/072 |
| 2022/0044988 A1* | 2/2022 | Park | H05K 3/3468 |
| 2024/0079372 A1* | 3/2024 | Omae | H01L 24/48 |

* cited by examiner

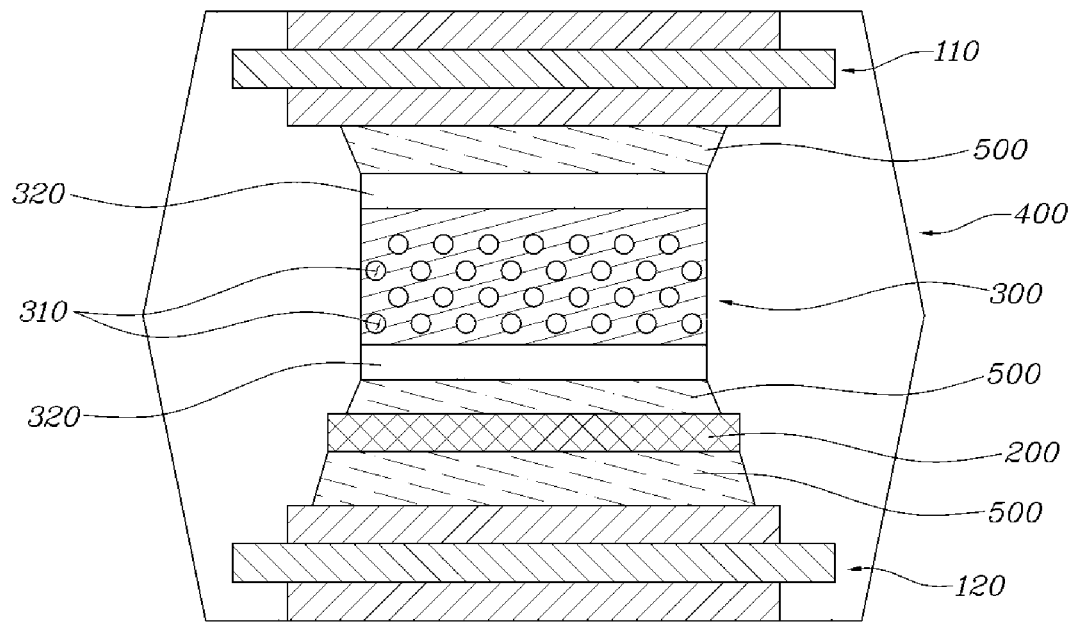
FIG. 4
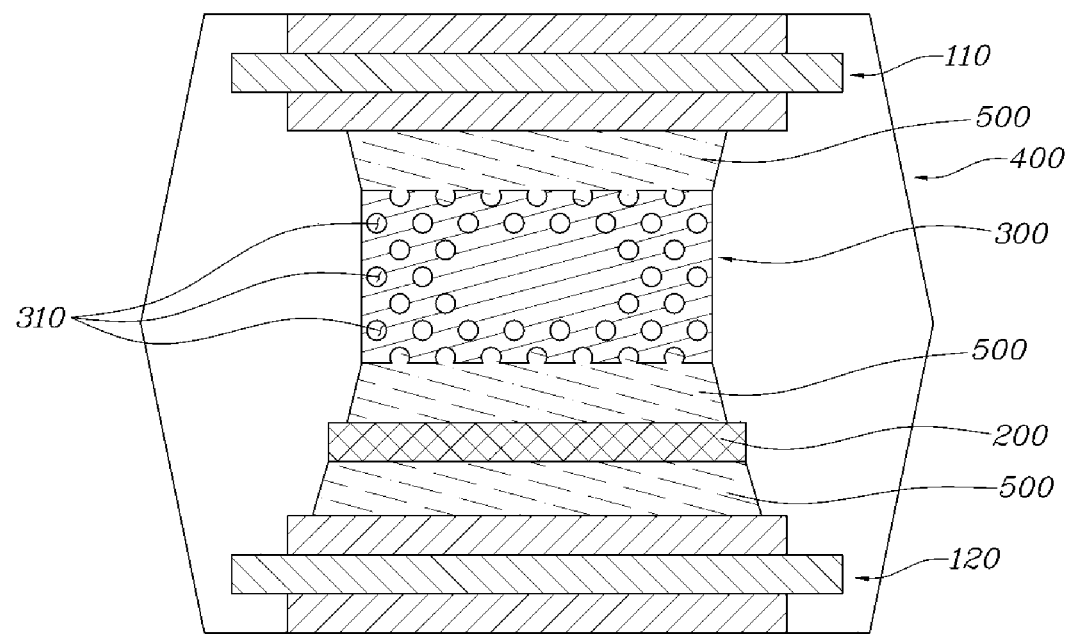

VEHICLE POWER MODULE

CROSS-REFERENCE TO RELATED APPLICATION

The present application claims priority to Korean Patent Application No. 10-2022-0106440, filed on Aug. 24, 2022, the entire contents of which is incorporated herein for all purposes by this reference.

BACKGROUND OF THE INVENTION

Field of the Present Disclosure

The present disclosure relates to a vehicle power module and a method of manufacturing the same, and more particularly to a technique related to a vehicle power module mounted on an inverter configured to operate a driving motor provided in an electric vehicle.

Description of Related Art

A power module is used to supply high voltage current to drive a motor of a hybrid vehicle and an electric vehicle.

Among the power modules, a double-sided cooling power module includes a substrate provided on each of the upper portion and the lower portion of a semiconductor chip, and a heat sink provided on the external surface of each substrate. The double-sided cooling power module has excellent cooling performance compared to a single-sided cooling power module having a heat sink on one side surface thereof. Accordingly, use of the double-sided cooling power module is gradually increasing.

The double-sided cooling power module used in an electric vehicle or the like has a power semiconductor chip, such as a silicon carbide (SiC) semiconductor chip and a gallium nitride (GaN) semiconductor chip, mounted between the two substrates, which results in high heat due to high voltage and vibration while driving. Therefore, to solve the above-described problems, it is important that the double-sided cooling power module satisfy both high strength and high heat dissipation characteristics.

In a double-sided cooling power module of the related art, a metal circuit in an upper substrate and a metal circuit in a lower substrate may be connected to each other, or a spacer may be provided to connect a semiconductor chip connected to the lower substrate to the upper substrate. Here, the spacer is connected to the metal circuit or the semiconductor chip by a bonding material such as solder.

When the power module is operated, heat is generated in the semiconductor chip, which may cause thermal expansion of the spacer and solder connected thereto. However, because each of the spacer and the solder has different Coefficient of thermal expansion (CTE), there is a problem in that the solder or the semiconductor chip is damaged at a bonding portion.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a vehicle power module including substrates spaced from each other in the vertical direction, a semiconductor ship connected to one of the substrates, a spacer configured to connect the semiconductor chip to the other of the substrates or to connect the one substrate to the other substrate, and a penetration portion formed to penetrate the spacer from the outside of the spacer to an inside thereof. Through the present configuration, when the spacer thermally expands, it is possible to reduce stress at a connection portion where the spacer is connected to the substrates or the semiconductor chip, preventing damage to a bonding portion configured to connect the spacer to the semiconductor chip or the substrates or damage to the semiconductor chip due to thermal expansion.

In accordance with the present disclosure, the above and other objects can be accomplished by the provision of a vehicle power module including an upper substrate and a lower substrate spaced from each other in a vertical direction, a semiconductor chip connected to one of the upper substrate and the lower substrate, and a spacer formed of a metal material containing copper and connecting the semiconductor chip to the other of the upper substrate and the lower substrate or to connect the upper substrate to the lower substrate, the spacer including a plurality of penetration portions formed to penetrate an inside thereof.

The vehicle power module may further include an insulation portion configured to mold and insulate the upper substrate, the lower substrate, the semiconductor chip, and the spacer through an insulation material.

The insulation portion may be inserted into a part of the penetration portions when molding the upper substrate, the lower substrate, the semiconductor chip, and the spacer.

The vehicle power module may further include a bonding portion bonding the spacer to at least one of the semiconductor chip, the upper substrate, or the lower substrate through a bonding material.

The bonding portion may be inserted into the penetration portions disposed at a position in contact with the spacer.

The vehicle power module may further include a conductive plate bonded to each of opposite end portions of the spacer, the conductive plate including an external surface thereof bonded to the bonding portion.

The plurality of penetration portions formed in the spacer may be spaced from each other with a predetermined distance.

The penetration portions formed in the spacer may be disposed on an external side of the spacer.

The upper substrate and the lower substrate may include a first metal portion connected to the semiconductor chip or the spacer, an insulation substrate including the first metal portion coupled to one side surface thereof, the insulation substrate being insulated from outside, and a second metal portion coupled to the other side of the insulation substrate, the second metal portion including a cooler coupled thereto.

A contact area of the spacer in contact with the semiconductor chip may be formed to be smaller than an area of the semiconductor chip.

The insulation portion may be formed of a material including a lower coefficient of thermal expansion than a coefficient of thermal expansion of the spacer, and thermal expansion force of the spacer is dispersed when the insulation portion is inserted into the penetration portions.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 3 is a cross-sectional view of a vehicle power module according to various exemplary embodiments of the present disclosure; and FIG. 4 is a cross-sectional view of a vehicle power module according to various exemplary embodiments of the present disclosure.

Figure 1:
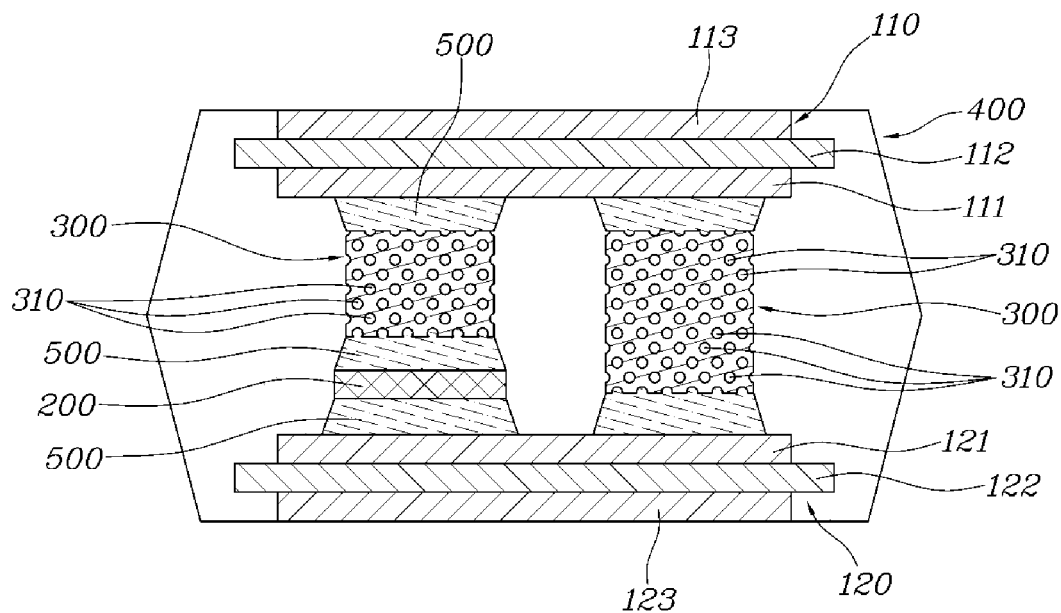
FIG. 1 is a cross-sectional view of a vehicle power module according to various exemplary embodiments of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Specific structural or functional descriptions provided in connection with the exemplary embodiments of the present disclosure disclosed in the specification or the application are merely illustrative for the purpose of describing embodiments according to an exemplary embodiment of the present disclosure. Furthermore, the present disclosure may be implemented in various forms, and should not be construed as being limited to the exemplary embodiments described in the specification or the application.

Because the exemplary embodiments of the present disclosure may be variously modified and may have various forms, specific embodiments are illustrated in the drawings and described in detail in the specification or the application. However, it should be understood that the exemplary embodiments according to the concept of the present disclosure are not intended to be limited to the specific disclosed forms, and include all modifications, equivalents, and substitutes that fall within the spirit and technical scope of the present disclosure.

Meanwhile, in the present disclosure, terms such as "first" and/or "second" may be used to describe various components, but the components are not limited by the terms. The terms are used only for distinguishing one component from other components. For example, a first component may be referred to as a second component, and similarly, a second component may also be referred to as a first component without departing from the scope of rights according to the concept of the present disclosure.

When one component is referred to as being "connected" or "joined" to another component, the one component may be directly connected or joined to the other component, but it should be understood that other components may be present therebetween. On the other hand, when the one component is referred to as being "directly connected to" or "directly in contact with" the other component, it should be understood that no other components are present therebetween. Other expressions for the description of relationships between components, such as "between" and "directly between" or "adjacent to" and "directly adjacent to", should be interpreted in the same manner.

The terms used in the specification are only used to describe specific embodiments, and are not intended to limit the present disclosure. In the present specification, an expression in a singular form also includes the plural sense, unless clearly specified otherwise in context. It should be understood that expressions such as "comprise" and "have" in the present specification are intended to designate the presence of indicated features, numbers, steps, operations, components, parts, or combinations thereof, but do not exclude the presence or addition of one or more features, numbers, steps, operations, components, parts, or combinations thereof.

Unless otherwise defined, all terms used herein, including technical and scientific terms, have the same meanings as commonly understood by those skilled in the art to which the present disclosure pertains. Terms such as those defined in commonly used dictionaries should be interpreted as having meanings consistent with their meanings in the context of the related technology. Furthermore, unless explicitly defined in the present specification, the terms should not be interpreted in an ideal or overly formal sense.

Hereinafter, the present disclosure will be described in detail through exemplary embodiments thereof with reference to the accompanying drawings. The same reference numerals in each drawing represent the same members.

In a vehicle power module according to an exemplary embodiment of the present disclosure, direct current of a high voltage battery provided in an electric vehicle is input, the input direct current is converted into alternating current, and the converted alternating current is output to a motor, making it possible to operate the motor.

Additionally, to perform miniaturization of the vehicle power module and improve cooling efficiency thereof, two separated substrates such as an upper substrate and a lower substrate are provided, and the two separated substrates are connected to each other in the vertical direction, achieving miniaturization thereof. Furthermore, the cooling efficiency may be improved by connecting a cooler to each of the upper substrate and the lower substrate in the vertical direction thereof.

Figure 2:
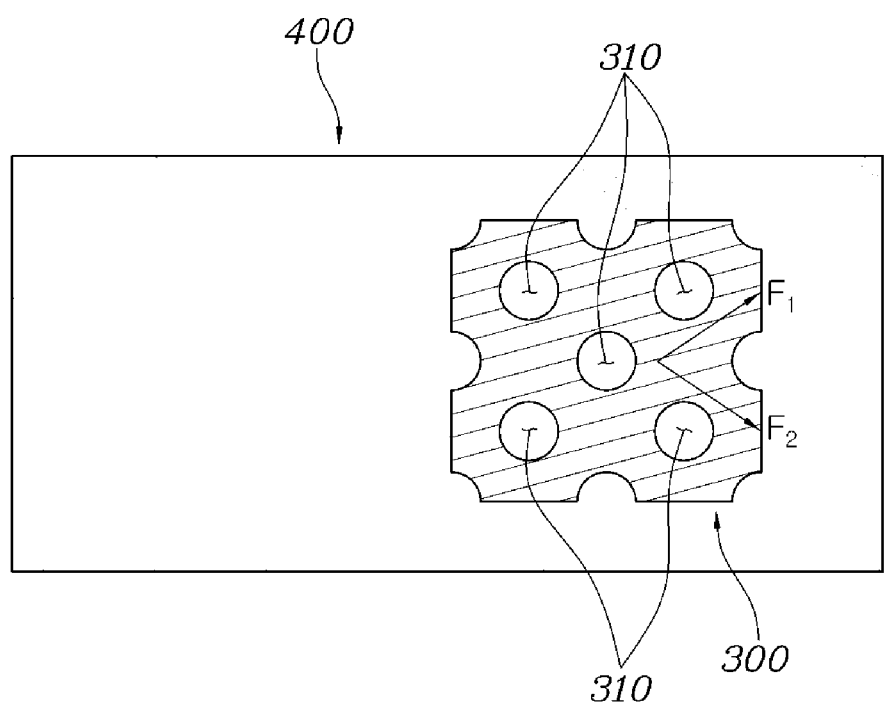
FIG. 2 is an enlarged cross-sectional view of a spacer of the vehicle power module according to the various exemplary embodiments of the present disclosure.

FIG. 1 is a cross-sectional view of a vehicle power module according to various exemplary embodiments of the present disclosure, and FIG. 2 is an enlarged cross-sectional view of a spacer 300 of the vehicle power module according to the various exemplary embodiments of the present disclosure.

An exemplary embodiment of the vehicle power module according to an exemplary embodiment of the present disclosure will be described with reference to FIG. 1 and FIG. 2.

The vehicle power module according to an exemplary embodiment of the present disclosure specifically includes an upper substrate 110 and a lower substrate 120 spaced from each other in the vertical direction, a semiconductor chip 200 connected to one of the upper substrate 110 and the lower substrate 120, and a spacer 300 formed of a metal material containing copper and configured to connect the semiconductor chip 200 to the other substrate or to connect the upper substrate 110 to the lower substrate 120, the spacer 300 including a plurality of penetration portions 310 formed to penetrate an inside thereof.

As shown in FIG. 1, in the vehicle power module, one surface of the upper substrate 110 and one surface of the lower substrate 120 are spaced from each other in the vertical direction to face each other, and the semiconductor chip 200 may be coupled to any one of the surfaces of the upper substrate 110 and the lower substrate 120 facing each other. Furthermore, in a state in which one surface of the semiconductor chip 200 is coupled to one of the upper substrate 110 and the lower substrate 120, the spacer 300 may connect the other of the upper substrate 110 and the lower substrate 120 to the other surface of the semiconductor chip 200.

In addition, the spacer 300 may connect the facing surfaces of the upper substrate 110 and the lower substrate 120 spaced from each other in the vertical direction.

Through the present configuration, the spacer connects the upper substrate 110 to the lower substrate 120, having an effect of miniaturizing a circuit board.

FIG. 1 is a cross-sectional view of the vehicle power module according to an exemplary embodiment of the present disclosure, and a plurality of semiconductor chips 200 and spacers 300 may be disposed in the vehicle power module according to an exemplary embodiment of the present disclosure. Additionally, a power lead connected to a motor of a vehicle or a DC terminal of a battery may be connected to any one of the upper substrate 110 and the lower substrate 120, and a signal lead may be connected to the semiconductor chip 200 to transmit a control signal from a control unit of a vehicle to the semiconductor chip 200.

In the exemplary embodiment of the present disclosure, as shown in FIG. 1, the semiconductor chip 200 may be connected to the upper surface of the lower substrate 120, and the spacer 300 may connect the upper surface of the semiconductor chip 200 to the lower surface of the upper substrate 110, or a plurality of spacers 300 may be disposed to connect the facing surfaces of upper substrate 110 and the lower substrate 120.

In the instant case, the spacer 300 may have a penetration portion 310 formed to be penetrated from the outside of the spacer 300 to the inside thereof, and a plurality of penetration portions 310 may be provided therein.

The vehicle power module may generate heat in the semiconductor chip 200 during operation thereof, and due to the heat generated in the semiconductor chip 200, the semiconductor chip 200, the upper substrate 110, the lower substrate 120, or the spacer 300 may thermally expand.

Each of the semiconductor chip 200, the upper substrate 110, the lower substrate 120, or the spacer 300 has a different Coefficient of thermal expansion (CTE). Accordingly, when thermal expansion occurs, the components undergo different amounts of thermal expansion at a contact portion between the respective components, which may cause damage to the components such as a crack.

In general, the CTE of the spacer 300 may be 10 to 20 (1/K), the CTE of the semiconductor chip 200 may be 3 to 4 (1/K), and the CTEs of the upper substrate 110 and the lower substrate 120 may be 8 to 18 (1/K).

As shown in FIG. 1 and FIG. 2, a plurality of penetration portions 310 may be formed in the spacer 300. Here, because the spacer 300 expands between the penetration portions 310 formed in the spacer 300, force generated when the spacer 300 thermally expands may be dispersed.

In more detail, when the semiconductor chip 200 operates and generates heat, the generated heat is conducted to the upper substrate 110, the lower substrate 120, or the spacer 300. Accordingly, due to the heat conducted thereto, volume expansion may occur in the upper substrate 110, the lower substrate 120, the semiconductor chip 200, and the spacer 300. In the instant case, according to the CTE, the coefficients of thermal expansion are different between the components at the same temperature, but the penetration portion 310 of the spacer 300 may disperse force caused by the different coefficients of thermal expansion therebetween.

Through the present configuration, it is possible to have an effect of reducing damage to the upper substrate 110, the lower substrate 120, or the semiconductor chip 200, each of which is connected to the spacer 300, due to thermal expansion of the spacer 300.

The vehicle power module may further include an insulation portion 400 configured to mold the upper substrate 110, the lower substrate 120, the semiconductor chip 200, and the spacer 300 using an insulation material and to insulate the same.

As shown in FIG. 1, the insulation portion 400 may be formed by molding the upper substrate 110, the lower substrate 120, the semiconductor chip 200, and the spacer 300 with an insulation material, making it possible to insulate the upper substrate 110, the lower substrate 120, the semiconductor chip 200, and the spacer 300 from the outside thereof in the state in which the upper substrate 110, the lower substrate 120, the semiconductor chip 200, and the spacer 300 are connected to each other.

The insulation portion 400 may be generally formed by epoxy molding, and may be formed as the insulation portion 400 through a curing operation after molding.

The insulation portion 400 insulates the upper substrate 110, the lower substrate 120, the semiconductor chip 200, and the spacer 300, having an effect of preventing malfunction of the upper substrate 110, the lower substrate 120, the semiconductor chip 200, and the spacer 300 due to external foreign substances.

In general, the CTE of the insulation portion 400 formed by the epoxy molding may be 10 to 18 (1/K).

When molding the upper substrate 110, the lower substrate 120, the semiconductor chip 200, and the spacer 300, the insulation portion 400 may be molded while being inserted into a part of the penetration portions 310.

As shown in FIG. 1 and FIG. 2, when the insulation portion 400 formed of an insulation material molds the upper substrate 110, the lower substrate 120, the semiconductor chip 200, and the spacer 300, the insulation material flows into some penetration portions 310 of the plurality of penetration portions 310 formed in the spacer 30, and is inserted into the penetration portions 310. Thereafter, the insulation portion 400 may wrap the outside of the upper substrate 110, the lower substrate 120, the semiconductor chip 200, and the spacer 300, and then may be cured in a state of being inserted into the spacer 300.

In the instant case, because the spacer 300 and the insulation portion 400 inserted into the penetration portions 310 have different CTEs, and the CTE of the insulation portion 400 is generally smaller than that of the spacer 300, the thermal expansion of the spacer 300 is suppressed by the insulation portion 400 when the spacer 300 thermally expands, having an effect of preventing damage to the upper substrate 110, the lower substrate 120, or the semiconductor chip 200, each of which is connected to the spacer 300, due to the thermal expansion of the spacer 300.

The spacer 300 may further include a bonding portion 500 configured to bond the spacer 300 to the semiconductor chip 200, the upper substrate 110, or the lower substrate 120 through an adhesive material.

As shown in FIG. 1, the bonding portion 500 may connect one end portion of the spacer 300 to the semiconductor chip 200 and connect the other end portion thereof to the upper substrate 110 or the lower substrate 120. Alternatively, the bonding portion 500 may connect opposite end portions of the spacer 300 to the upper substrate 110 and the lower substrate 120, respectively. Furthermore, the bonding portion 500 may connect the semiconductor chip 200 to the upper substrate 110 or the lower substrate 120.

The general bonding portion 500 may be formed of an adhesive material such as solder, and the CTE of the bonding portion 500 may be 22 to 32 (1/K).

Because the CTE of the bonding portion 500 is formed to be greater than the CTE of the spacer 300, damage such as cracks may occur between the spacer 300 and the bonding portion 500 during thermal expansion.

To prevent the present damage therebetween, when the bonding portion 500 is cured, the bonding portion 500 may be inserted into the penetration portion 310 at a position in contact with the spacer 300.

The bonding portion 500 serving as an adhesive material has fluidity. Here, when the spacer 300 is connected to the upper substrate 110, the lower substrate 120, or the semiconductor chip 200, the bonding portion 500 may be partially connected to the end portion of the spacer 300 and cured. In the instant case, the bonding portion 500 may be partially cured while being inserted into the penetration portions 310 positioned at the end portion of the spacer 300.

Through the present configuration, when the spacer 300 is thermally deformed, thermal expansion thereof is suppressed by the bonding portion 500 inserted into the penetration portion 310, having an effect of preventing damage to the upper substrate 110, the lower substrate 120, the semiconductor chip 200, or the bonding portion 500, each of which is connected to the spacer 300, due to thermal expansion of the spacer 300.

The insulation portion 400 may be formed of a material having a lower coefficient of thermal expansion than that of the spacer 300, and accordingly, thermal expansion force of the spacer 300 may be dispersed when the insulation portion 400 is inserted into the penetration portion 310.

As shown in FIG. 2, when the insulation portion 400 is molded, the same may be molded while being inserted into the plurality of penetration portions 310 formed in the spacer 300, and the insulation portion 400 may be formed of a material having a lower coefficient of thermal expansion than that of the spacer 300 formed of a metal material containing copper.

Through the present configuration, the insulation portion 400 is inserted into the penetration portion 310 of the spacer 300 and molded therein. Here, when the power module is operated and thermal expansion occurs, the insulation portion 400 having the lower coefficient of thermal expansion than that of the spacer 300 suppresses the thermal expansion of the spacer 300 and disperses expansion force as shown in FIG. 2, having an effect of reducing the damage rate of the bonding portion 500, the semiconductor chip 200, the upper substrate 110, or the lower substrate 120.

As the various exemplary embodiments of the space according to present disclosure, the plurality of penetration portions 310 formed in the spacer 300 may be spaced from each other with a predetermined distance.

As shown in FIG. 1 and FIG. 2, a plurality of penetration portions formed to penetrate the spacer 300 from the outside of the spacer 300 to the inside thereof may be formed at a predetermined distance or in a predetermined pattern.

Because the penetration portions 310 are spaced from each other with a predetermined distance or in a predetermined pattern, the spacer 300 may have the penetration portions 310 formed entirely therein.

The penetration portion 310 formed entirely in the spacer 300 may be formed in a direction crossing a direction in which the spacer extends or in a direction parallel in a direction in which the upper and lower substrates 110 and 120 extend.

When the spacer 300 thermally expands through heat conducted from the semiconductor chip 200, expansion force is generated, and the direction of the expansion force may be confirmed as shown in FIG. 2. Because a plurality of penetration portions 300 formed to penetrate the inside of the spacer 300 are spaced from each other, expansion forces F1 and F2 generated during thermal expansion may be formed between the plurality of penetrations portions 300, reducing the expansion forces.

Through the present configuration, when the spacer 300 is thermally deformed to expand the same, the expansion force may be reduced by distributing the expansion over the entire area of the spacer 300.

FIG. 3 is a cross-sectional view of a vehicle power module according to various exemplary embodiments of the present disclosure.

A spacer according to the various exemplary embodiments of the present disclosure may further include a conductive plate 320 bonded to opposite end portions of the spacer 300, the conductive plate 320 including external surfaces, each of which is bonded to a corresponding one of the bonding portions 500.

As shown in FIG. 3, the conductive plate 320 may be connected to the opposite end portions of the spacer 300 in the longitudinal direction, and the conductive plate 320 may be bonded and connected to the upper substrate 110, the lower substrate 120, or the semiconductor chip 200 by the bonding portion 500.

According to the various exemplary embodiments of the present disclosure, the conductive plates 320 are respectively coupled to the opposite end portions of the spacer 300, and the conductive plate 320 is bonded to and coupled to the upper substrate 110, the lower substrate 120, or the semiconductor chip 200 by the bonding portion 500, preventing adverse effects described in the various exemplary embodiments in which the bonding portion 500 permeates into the penetration portion 310 on the end side of the spacer 300 whereby bonding deteriorates when the spacer 300 is connected to the upper substrate 110, the lower substrate 120, or the semiconductor chip 200. Furthermore, there is an effect of preventing the bonding portion 500 from excessively permeating into the penetration portion 310.

Additionally, the bonding portion 500 is coupled only to the conductive plate 320, and the insulation portion 400 is introduced into the penetration portion 310 formed in the spacer 300 and is cured, having an effect of preventing damage caused by a difference in CTE between the spacer 300 and the conductive plate 320 when the semiconductor chip heats up.

FIG. 4 is a cross-sectional view of a vehicle power module according to various exemplary embodiments of the present disclosure.

As various exemplary embodiments of the space according to the present disclosure, the penetration portion 310 formed in the spacer 300 may be disposed on the external side of the spacer 300.

As shown in FIG. 4, in the various exemplary embodiments of the spacer 300 of the present disclosure, the penetration portions 310 formed in the spacer 300 may be mainly disposed in the longitudinal end portion of the spacer 300 in contact with the bonding portion 500 and the side surface portion thereof in contact with the insulation portion 400, and may not be disposed in the center portion of the spacer 300.

When heat is generated in the spacer 300 to expand the same, the maximum stress is applied to the external side of the spacer 300. To solve the present problem, in the various exemplary embodiments of the present disclosure, the penetration portion 310 may be disposed on the external side of the spacer 300.

When the spacer 300 thermally expands, the maximum stress occurs at a portion of the external side of the spacer 300, the portion being bonded to the bonding portion 500, which causes damage to the bonding portion therebetween.

To prevent the present damage, the penetration portion 310 may be disposed only on the external side of the spacer 300 so that the bonding portion 500 is inserted into the penetration portion 310 disposed at a position of the spacer 300 adjacent to the bonding portion 500, and the insulation portion 400 may be formed to permeate into the penetration portion 310 and cured at the side surface portion of the spacer 300.

The stress on the external side of the spacer 300 is reduced at the bonding portion where the spacer 300 is bonded to the upper substrate 110, the lower substrate 120, or the semiconductor chip 200, having an effect of reducing damage to the bonding portion 500 and improving thermal conductivity of the spacer 300 at the center portion thereof.

The upper substrate 110 and the lower substrate 120 may include first metal portions 111 and 121 connected to the semiconductor chip 200 or the spacer 300, insulation substrates 112 and 122 including the first metal portions 111 and 121 respectively coupled to one side surfaces thereof, the insulation substrates 112 and 122 being insulated from, the, the outside thereof, and second metal portions 113 and 123 respectively coupled to the other sides of the insulation substrates 112 and 122, the second metal portions 113 and 123 including a cooler coupled thereto.

As shown in FIG. 1, the upper substrate 110 and the lower substrate 120 may include the first metal portions 111 and 121 formed of a metal circuit, and each of the first metal portions 111 and 121 may be provided on a corresponding one of one surface of each of the insulation substrates 112 and 122 insulated from the outside.

Each of the first metal portions 111 and 121 may be disposed on a corresponding one of the surfaces of the upper substrate and the lower substrate facing each other, and the first metal portions 111 and 121 respectively formed on the upper substrate 110 and the lower substrate 120 are connected to each other through the spacer 300. Alternatively, one of the first metal portions 111 and 121 may be connected to the semiconductor chip 200, and the other of the first metal portions 111 and 121 may be connected to the semiconductor chip 200 through the spacer 300. The insulation substrates 112 and 122 may insulate the spacer 300 and the semiconductor chip 200 from the outside.

Furthermore, each of the second metal portions 113 and 123 may be provided on a corresponding one of the external surfaces of the insulation substrates 112 and 122, and a cooler may be connected to each of the outsides of the upper substrate 110 and the lower substrate 120 through each of the second metal portions 113 and 123. Through the present configuration, the upper and lower coolers cool the upper and lower portions of the vehicle power module, having an effect of maximizing operating efficiency of the vehicle power module.

A contact area of the spacer 300 in contact with the semiconductor chip 200 may be formed to be smaller than an area of the semiconductor chip 200.

As shown in FIG. 1, the spacer 300 is connected to the semiconductor chip 200, and a connected area may be formed to be smaller than an area of the semiconductor chip 200.

The spacer 300 may be formed of a material capable of performing both thermal conduction and electrical conduction. Here, when the spacer 300 is formed to be greater than the semiconductor chip 200, the probability of damage to the semiconductor chip 200 increases during thermal expansion at high temperature. Accordingly, the cross section of the spacer 300 may be formed to be smaller than the area of the semiconductor chip 200.

As is apparent from the above description, the present disclosure provides a vehicle power module configured to connect an upper substrate or a lower substrate to a semiconductor chip, and to form a plurality of penetration portions in a spacer configured to connect the upper substrate to the lower substrate. Through the plurality of penetration portions, it is possible to reduce stress generated when the spacer thermally expands due to heat generation of the semiconductor chip, having an effect of reducing probability of damage to a bonding portion configured to connect the spacer to the semiconductor chip, the upper substrate, and the lower substrate.

Furthermore, the coefficient of thermal expansion of the spacer and the coefficients of thermal expansion of an insulation portion and the bonding portion are different, and the insulation portion and the bonding portion are inserted into the penetration portions formed in the spacer and cured therein, having an effect of preventing thermal deformation of the spacer such as expansion of the spacer at high temperature or contraction thereof at low temperature, and reducing probability of damage to the bonding portion configured to connect the spacer to the upper substrate and the lower substrate when the spacer is thermally expanded or contracted.

Furthermore, in the various exemplary embodiments of the present disclosure, a conductive plate is bonded to opposite end portions of the spacer, and as the conductive plate is connected to the bonding portion. Accordingly, it is possible to prevent solder forming the bonding portion from being excessively inserted into the penetration portions, having an effect of preventing defective connection between the spacer and the bonding portion.

Furthermore, in the various exemplary embodiments of the present disclosure, the penetration portion formed in the spacer is disposed only in the external region of the spacer, having an effect of reducing stress on an external side of the spacer, the external side having the maximum stress applied thereto during thermal expansion, and improving thermal conductivity of the center portion of the spacer.

The effects of the present disclosure are not limited to the above-mentioned effects, and other effects not mentioned will be clearly understood by those skilled in the art from the detailed description.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A vehicle power module comprising:
   an upper substrate and a lower substrate spaced from each other in a vertical direction;
   a semiconductor chip connected to a first one of the upper substrate and the lower substrate;
   a spacer connecting the semiconductor chip to a second one of the upper substrate and the lower substrate or connecting the upper substrate to the lower substrate, wherein the spacer is formed of a metal material including a copper and includes a plurality of penetration portions formed to penetrate an inside thereof; and
   an insulation portion configured to mold and insulate the upper substrate, the lower substrate, the semiconductor chip, and the spacer through an insulation material,
   wherein the insulation portion is inserted into a part of the penetration portions when molding the upper substrate, the lower substrate, the semiconductor chip, and the spacer.

2. The vehicle power module of claim 1, further including a bonding portion bonding the spacer to at least one of the semiconductor chip, the upper substrate, or the lower substrate through a bonding material.

3. The vehicle power module of claim 2, wherein the bonding portion is inserted into penetration portions disposed at a position in contact with the spacer, among the plurality of penetration portions.

4. The vehicle power module of claim 2, further including a conductive plate bonded to each of opposite end portions of the spacer, the conductive plate including an external surface thereof bonded to the bonding portion.

5. The vehicle power module of claim 1, wherein the plurality of penetration portions formed in the spacer are spaced from each other with a predetermined distance.

6. The vehicle power module of claim 1, wherein the penetration portions formed in the spacer are disposed on an external side of the spacer.

7. The vehicle power module of claim 1, wherein the upper substrate and the lower substrate include:
   a first metal portion connected to the semiconductor chip or the spacer,
   an insulation substrate including the first metal portion coupled to one side surface thereof, the insulation substrate being insulated from outside, and
   a second metal portion coupled to the other side of the insulation substrate.

8. The vehicle power module of claim 1, wherein a contact area of the spacer in contact with the semiconductor chip is smaller than an area of the semiconductor chip.

9. The vehicle power module of claim 1, wherein the insulation portion is formed of a material including a lower coefficient of thermal expansion than a coefficient of thermal expansion of the spacer, and thermal expansion force of the spacer is dispersed when the insulation portion is inserted into the penetration portions.

* * * * *